United States Patent
Le Coz

(10) Patent No.: US 9,105,509 B2
(45) Date of Patent: Aug. 11, 2015

(54) BALL GRID ARRAY AND CARD SKEW MATCHING OPTIMIZATION

(75) Inventor: Christian R. Le Coz, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 1272 days.

(21) Appl. No.: 12/971,239

(22) Filed: Dec. 17, 2010

(65) Prior Publication Data

US 2011/0088007 A1  Apr. 14, 2011

Related U.S. Application Data

(62) Division of application No. 11/275,481, filed on Jan. 9, 2006, now Pat. No. 7,800,184.

(51) Int. Cl.
| | |
|---|---|
| *G06F 17/50* | (2006.01) |
| *H01L 27/11* | (2006.01) |
| *H01L 21/285* | (2006.01) |
| *H01L 21/768* | (2006.01) |
| *H01L 27/108* | (2006.01) |
| *H01L 29/66* | (2006.01) |

(52) U.S. Cl.
CPC ...... *H01L 27/1104* (2013.01); *H01L 21/28525* (2013.01); *H01L 21/76895* (2013.01); *H01L 27/10867* (2013.01); *H01L 27/11* (2013.01); *H01L 29/66181* (2013.01)

(58) Field of Classification Search
CPC ............ H04L 27/1104; H04L 27/10867; H04L 27/11; H04L 21/76895; H04L 21/28525; H04L 29/66181; G06F 17/5031
USPC .......... 702/176, 178, 186; 716/108, 113, 114, 716/134
See application file for complete search history.

(56) References Cited

U.S. PATENT DOCUMENTS

| | | |
|---|---|---|
| 5,500,804 A | 3/1996 | Honsinger et al. |
| 5,849,610 A | 12/1998 | Zhu |
| 6,161,215 A | 12/2000 | Hollenbeck et al. |

(Continued)

OTHER PUBLICATIONS

Amir Owzar et al., "Analytical Expression for Signal Propagation Delay of Off-Chip Interconnection for SIP Application", IEEE, 2007, pp. 848-851.

(Continued)

*Primary Examiner* — Manuel L Barbee
(74) *Attorney, Agent, or Firm* — Gibb & Riley, LLC; David A. Cain, Esq.

(57) ABSTRACT

A method, system, and computer storage device simultaneously compare the timing of conductive signal paths in a substrate and a printed circuit board to achieve a predetermined signal timing goal. Specifically, the method automatically calculates a substrate-based length of time it will take a signal to pass within each substrate conductor (within a conductor group) and automatically calculates a board-based length of time it will take a signal to pass within each of board conductors (within the conductor group). The method automatically adds the substrate-based length of time and the board-based length of time for each of the combined substrate-board conductors to produce a combined timing for each of the combined substrate-board conductors. The method automatically compares the combined timing of each the combined substrate-board conductors to determine whether the combined substrate-board conductors pass signals within a predetermined timing variance limit.

17 Claims, 9 Drawing Sheets

(56) References Cited

U.S. PATENT DOCUMENTS

| | | | |
|---|---|---|---|
| 6,442,057 | B1 | 8/2002 | Song et al. |
| 6,836,163 | B2 | 12/2004 | Spehar |
| 7,268,599 | B1 | 9/2007 | Hwang |
| 7,398,333 | B2 | 7/2008 | Hampel et al. |
| 7,622,384 | B2 | 11/2009 | Memis |
| 2009/0119630 | A1* | 5/2009 | Binder et al. .................... 716/6 |

OTHER PUBLICATIONS

Takayuki Ohshima et al., "Evaluation and Reduction of Simulation Error of Chip-to-Chip Signal Delay", IEEE, 2005, pp. 163-166.

Heinz Mattes et al., "Propagation Delay Calculation for Interconnection Nets on Printed Circuit Boards by Reflected Waves", 28th ACM/IEEE Design Automation Conference, 1991, pp. 567-572.

* cited by examiner

BALL GRID ARRAY AND CARD SKEW MATCHING OPTIMIZATION

BACKGROUND

The present invention relates to signal timing and conductor length within integrated circuits, and more specifically, to methods, systems, and storage devices that simultaneously compare the timing of conductive signal paths in a substrate and a printed circuit board to achieve a predetermined signal timing goal.

Customers of integrated circuit chip manufacturing houses place orders for devices that have specific characteristics to achieve the customer's goals. For example, such customers may require the devices that are ordered to have time delay relationships between groups of nets (groups of wires) as they travel through flip-chip plastic ball grid array (FCPBGA) and printed circuit board wiring. Typically, customers view the substrate exclusively and ask for time delay to be added to nets whose ball grid array (BGA) pins are closest to the chip. As termination of nets moves closer to the edge of the FCPBGA, the time delay added is progressively reduced. This added delay, when considering jointly (the substrate and the board), is not needed and causes unnecessary delay to be added in the board. The embodiments described below address such issues and provide the designer visibility to propagation values of a substrate/card system.

SUMMARY

One exemplary method simultaneously compares the timing of conductive signal paths in a substrate and a printed circuit board to achieve a predetermined signal timing goal. Specifically, the method identifies a conductor group within an integrated circuit design using a computing device. The conductor group comprises a plurality of substrate conductors within the substrate and a plurality of board conductors within the printed circuit board. Each combination of substrate conductor and board conductor comprises one of a plurality of combined substrate-board conductors.

The method automatically calculates a substrate-based length of time it will take a signal to pass within each of the substrate conductors (within the conductor group) based on the length of each of the substrate conductors and based on the speed with which signals pass within the substrate. The method similarly automatically calculates a board-based length of time it will take a signal to pass within each of the board conductors (within the conductor group) based on the length of each of the board conductors and based on the speed with which signals pass within the printed circuit board.

The methods herein can use an actual routed length they process when specific wire routing ("routed design"). Otherwise, when they process prospective contact to BGA x,y locations only, one of two different methods of predicted routed length is provided.

The method automatically adds the substrate-based length of time and the board-based length of time for each of the combined substrate-board conductors to produce a combined timing for each of the combined substrate-board conductors. The method automatically compares the combined timing of each the combined substrate-board conductors to determine whether the combined substrate-board conductors pass signals within a predetermined timing variance limit. The method automatically reports results of comparing the combined timing of each of the combined substrate-board conductors.

Another computerized method of simultaneously comparing timing of conductive signal paths in a substrate and a printed circuit board to achieve a predetermined signal timing goal again identifies a conductor group within the integrated circuit design (again using a computing device. Again, the conductor group comprises a plurality of substrate conductors within the substrate and a plurality of board conductors within the printed circuit board.

Each of the substrate conductors comprises a first substrate conductor end that is electrically connected to at least one external electrical connection of an integrated circuit chip attached to the substrate, and a second substrate conductor end that is electrically connected to at least one of the board conductors within the printed circuit board. Similarly, each of the board conductors comprises a first board conductor end that is electrically connected to at least one of the substrate conductors at the second substrate conductor end, and a second board conductor end that is positioned at a predetermined position within the printed circuit board.

The second substrate conductor end of the substrate conductors is connected to the first board conductor end of the board conductors through a ball grid array of electrical connections between the substrate and the printed circuit board. Each combination of substrate conductor and board conductor that electrically connect one the external electrical connection of the integrated circuit chip to the predetermined position within the printed circuit board comprises one of a plurality of combined substrate-board conductors.

This method similarly automatically calculates a substrate-based length of time it will take a signal to pass from the first substrate conductor end to the second substrate conductor end of each of the substrate conductors within the conductor group based on the length of each of the substrate conductors and based on the speed with which signals pass within the substrate. The method also automatically calculates a board-based length of time it will take a signal to pass from the first board conductor end to the second board conductor end of each of the board conductors within the conductor group based on the length of each of the board conductors and based on the speed with which signals pass within the printed circuit board. This method again automatically adds the substrate-based length of time and the board-based length of time for each of the combined substrate-board conductors to produce a combined timing for each of the combined substrate-board conductors. The method automatically compares the combined timing of each the combined substrate-board conductors to determine whether the combined substrate-board conductors pass signals within a predetermined timing variance limit. This method also automatically reports results of the compares of the combined timing of each of the combined substrate-board conductors.

A computer storage device embodiment herein comprises a computer-readable storage medium storing instructions executable by a computer to cause the computer to perform a method that simultaneously compares the timing of conductive signal paths in a substrate and a printed circuit board to achieve a predetermined signal timing goal. Specifically, the method identifies a conductor group within an integrated circuit design using a computing device. The conductor group comprises a plurality of substrate conductors within the substrate and a plurality of board conductors within the printed circuit board. Each combination of substrate conductor and board conductor comprises one of a plurality of combined substrate-board conductors. The method automatically calculates a substrate-based length of time it will take a signal to pass within each of the substrate conductors (within the conductor group) based on the length of each of the substrate conductors and based on the speed with which signals pass within the substrate. The method similarly automatically calculates a board-based length of time it will take a signal to pass within each of the board conductors (within the conductor group) based on the length of each of the board conductors and based on the speed with which signals pass within the printed circuit board. The method automatically adds the substrate-based length of time and the board-based length of time for each of the combined substrate-board conductors to produce a combined timing for each of the combined substrate-board conductors. The method automatically compares the combined timing of each the combined substrate-board conductors to determine whether the combined substrate-board conductors pass signals within a predetermined timing variance limit. The method automatically reports results of comparing the combined timing of each of the combined substrate-board conductors.

DETAILED DESCRIPTION

Figure 1:
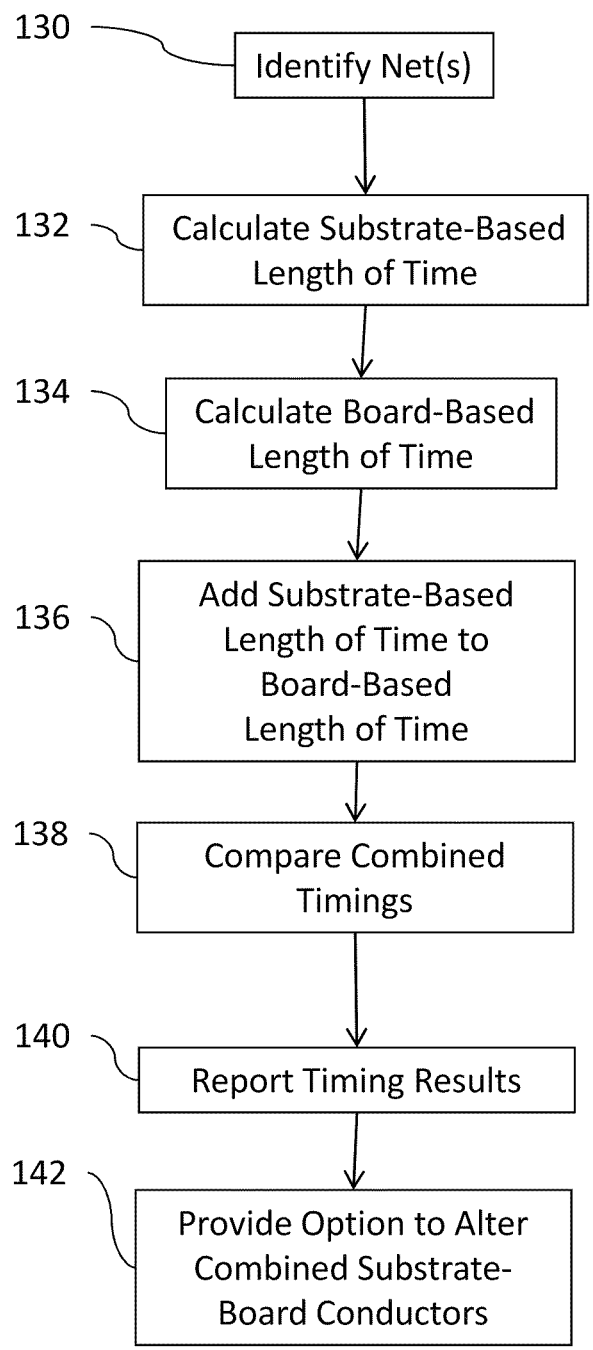
FIG. 1 is a flow diagram illustrating aspects of the embodiments herein.

As mentioned above, customers erroneously view the substrate separately from the printed circuit board and ask for time delay to be added to nets whose ball grid array (BGA) pins are closest to the chip. As termination of nets moves closer to the edge of the flip-chip plastic ball grid array (FCPBGA), the time delay added is progressively reduced.

However, this type of adjustment fails to take into account the board delay and results in adding needless wire length to both board and substrate. To illustrate, referring to FIG. 6, assume that a group of nets, emanating from the chip and terminating at the substrate BGA are clustered in the pattern enclosed by the ellipse (354). Further, assume the wire inside the circuit board connecting to the BGA inside the ellipse must pass through an imaginary line (356) parallel to the substrate edge but inside the board. Lastly, assume propagation delays of a signal travelling in a substrate and board are equal. By tracing the substrate path of nets to several BGA's inside the ellipse and subsequently to the imaginary line, the total length, is equal. Meanwhile, separate treatment of substrate adds length. As a response, the board designer is forced to add length to the nets that terminate closer to the edge of substrate.

There are complicating factors that make the calculation more difficult such as: 1) the difference in propagation delay between the FCPBGA and the Board (e.g., approximately 1 ps/mm); and 2) the nets of BGA terminations that are located lateral to major axis of the ellipse (352). As nets are terminated increasingly lateral to the major axis, total substrate and board length will deviate shorter and/or longer from the BGA located on the major axis. The magnitude of the deviation is larger at the corner (350) and smaller towards the centerline of the chip (354). 3) Also, the design includes a period of time where the actual conductor is not designed but a prospective x,y location of chip connection and BGA connection are defined.

The embodiments herein input netnames, BGA and "controlled collapse chip connection" (C4) x,y coordinate, grouping by netname, propagation delay constants of board and FCPBGA, and required skew. From this, the embodiments herein calculate the added length on a specific netname basis.

The embodiments herein take a broader view of time delay by expanding the measurement of delay to include the board area's BGA escape. The BGA escape is the amount of delay that will occur to the signals as they travel within the wiring of the printed circuit board and the embodiments herein coordinate this BGA escape delay into the delay calculation of the nets within the integrated circuit chip substrate to avoid unnecessary duplicative addition of delay wiring to the printed circuit board and chip substrate.

Conventionally, the delay adjustment activity is serially resolved by the FCPBGA designer and the board designer. Thus, conventionally the designer of the flip chip designed the delay of the wiring within the substrate to simultaneously output signals of a given group of nets at the ball grid array (within a given time intolerance). In order to do this, the flip chip designer increased the length of various wires to increase the delay of certain signals to make them the same as other signals that were arriving at the ball grid array later. After this work was completed by the flip chip designer, the printed circuit board designer then performed a similar process of adding delay to certain wires (to increase delay) in order to simultaneously output signals of a given net from the printed circuit board. The manner in which this was performed serially resulted in the counterproductive adding line length to both the FCPBGA and the printed circuit board.

In order to address such issues, the embodiments herein simultaneously design the wiring to a fixed point or line in space. For example, this line in space can be positioned just outside the outline of the FCPBGA, to the edge of the printed circuit board, or to any other desired point or line. This allows the FCPBGA designer to guarantee a time delay equality to a given tolerance. Then, the board designer needs only to adjust the skew for issues of termination distance differences on the board. Additional embodiments provide timing adjustments (additional wiring lengths) in the FCPBGA to compensate for board termination differences. Thus, the embodiments herein ensure that time delay is being properly accounted, thereby avoiding extraneous hours by designers, longer wiring, designs that are subject to more noise due to serpentines, and loss of important wiring channels area.

Therefore, as shown in flowchart form in FIG. 1, one exemplary embodiment herein is a method of simultaneously comparing timing of conductive signal paths in the substrate and the printed circuit board to achieve a predetermined signal timing goal. All steps shown in FIG. 1 can be automatically performed by a computerized device, such as those discussed below. As shown in FIG. 1, this method identifies conductor groups (nets) within the integrated circuit design 130.

Figure 2:
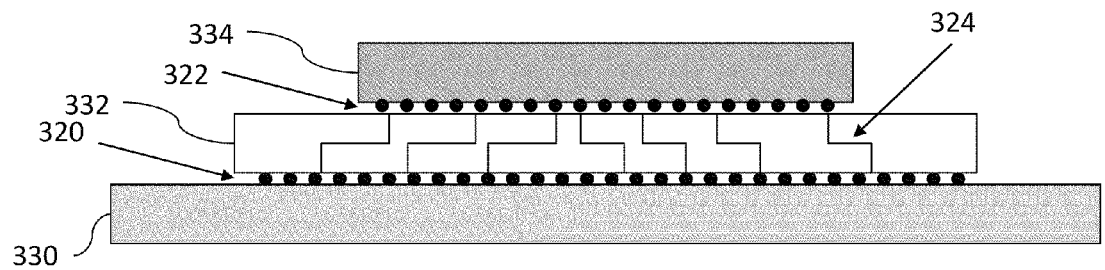
FIG. 2 is a cross-sectional schematic diagram illustrating one exemplary structure of the embodiments herein.
Figure 3:
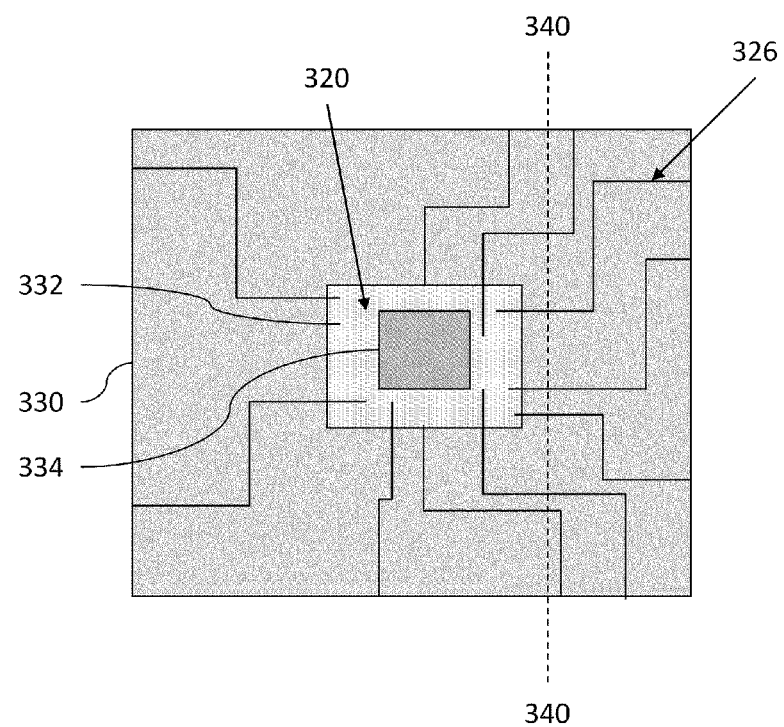
FIG. 3 is a top-view schematic diagram illustrating the structure shown in FIG. 2.

As also shown in FIGS. 2 and 3, the conductor group comprises a plurality of substrate conductors 324 within a substrate 332 of an integrated circuit chip 334 and at least a portion of the plurality of board conductors 326 within the printed circuit board 330. FIG. 2 illustrates the ball grid array 320 that connects the substrate 332 to the printed circuit board 330. Further, the substrate 332 is transparent in FIG. 3 (when in reality it is not transparent) so that the underlying ball grid array 320 and the connections to the board conductors 326 can be more easily illustrated.

FIG. 2 also illustrates the pin connections (for example, C4 pin connections) that connect the substrate 332 in the integrated circuit chip 334. FIG. 3 (which is a top view of the same structure shown in cross-sectional view in FIG. 2) also illustrates an exemplary fixed line 340 to which the chip designer can calculate all timing synchronization. As would be understood by those ordinarily skilled in the art, and drawings included herein are simplifications of the actual structures involved, and the actual structures involved would include additional elements, many more wires, many more connections, etc. The drawings are intentionally simplified in order to more clearly illustrate the salient features herein.

As also shown in FIG. 2, each of the substrate conductors 324 comprises a first substrate conductor end that is electrically connected to at least one external electrical connection 322 of the integrated circuit chip 334, and a second substrate conductor end that is electrically connected to at least one of the board conductors 326 within the printed circuit board through the ball grid array connections 320. Similarly, each of the board conductors 326 comprises a first board conductor end that is electrically connected to at least one of the substrate conductors 324 at the second substrate conductor end through the ball grid array 320, and a second board conductor end that is positioned at a predetermined position within the printed circuit board (e.g., 340). The predetermined position 340 within the printed circuit board can be, for example, the same location (given point) for all of the board conductors within the conductor group, a line parallel to a physical edge of the printed circuit board, or any other location that is convenient for the printed circuit board designer to initiate timing calculations.

Each combination of substrate conductor 324 and (portion of) board conductor 326 (and ball grid array connection) that electrically connect one the external electrical connections 322 of the integrated circuit chip 334 to the predetermined position 340 within the printed circuit board 330 is referred to herein for convenience as a "combined substrate-board conductor."

The speed with which signals pass within the substrate is different than the speed with which signals pass within the printed circuit board because of differences in dielectric constant of insulators. Therefore, as shown in FIG. 1, the methods herein (in item 132) automatically calculate a substrate-based length of time it will take a signal to pass from the first substrate conductor end to the second substrate conductor end of each of the substrate conductors within the conductor group, based on the length of each of the substrate conductors and based on the speed with which signals pass within the substrate.

In item 134, the methods also automatically calculate a board-based length of time it will take a signal to pass from the first board conductor end to the second board conductor end of each of the board conductors within the conductor group, based on the length of each of the board conductors and based on the speed with which signals pass within the printed circuit board.

Then in item 136, the exemplary methods automatically add the substrate-based length of time and the board-based length of time for each of the combined substrate-board conductors to produce a combined timing for each of the combined substrate-board conductors. In item 138, the methods automatically compare the combined timing of each the combined substrate-board conductors to determine whether the combined substrate-board conductors of a given net pass signals within a predetermined timing variance limit. This method also automatically reports results of comparing of the combined timing of each of the combined substrate-board conductors in item 140.

Figure 4:
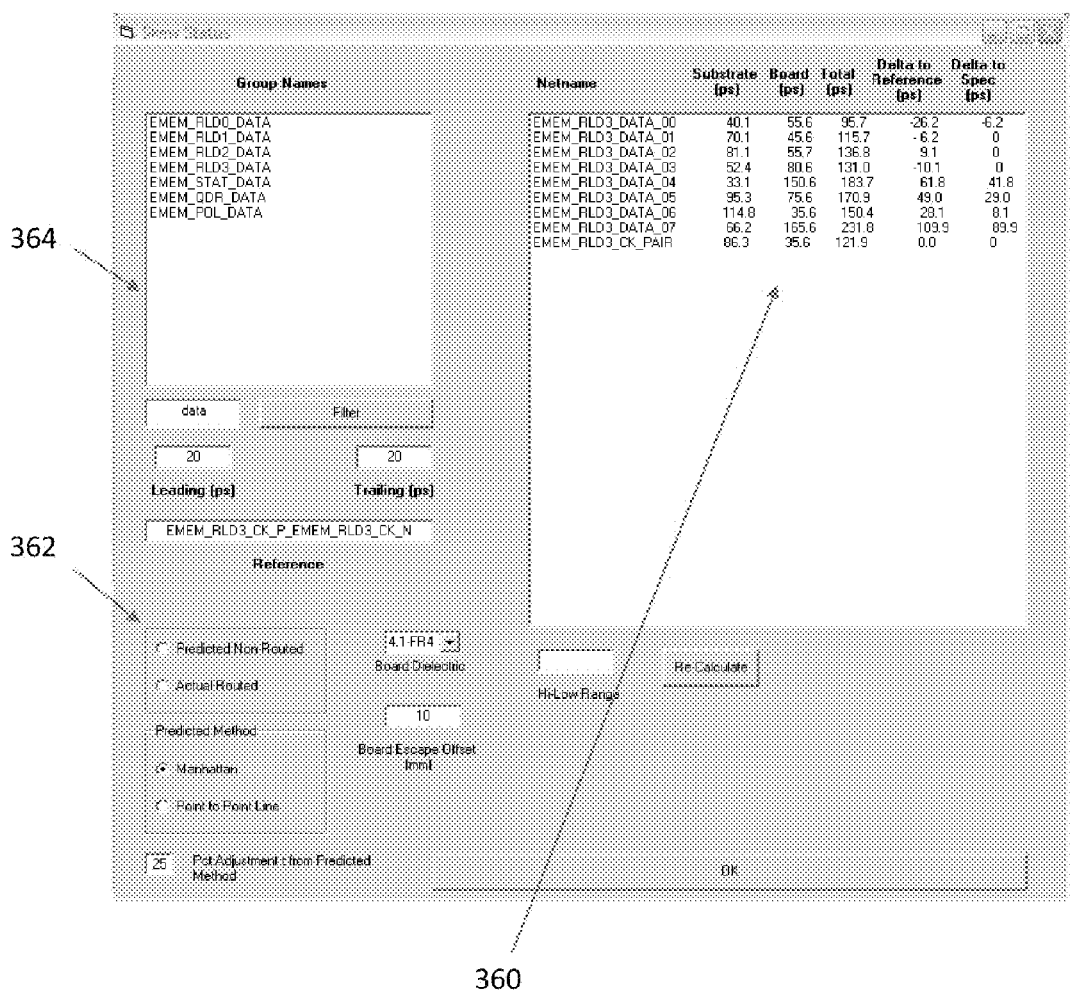
FIG. 4 is a schematic diagram of a display produced by embodiments herein.

FIG. 4 illustrates one example of one of the automatic reports produced in item 140. More specifically, as shown in item 364, group names of groups of nets are shown. In item 360, this exemplary display lists the names of the nets that are contained within one of the groups shown in item 364. Again, each of the nets shown in item 364 is a grouping of the combined substrate-board conductors. Item 364 also illustrates: the substrate-based length of time of each of the combined substrate-board conductors within the conductor group (net); the board-based length of time of each of the combined substrate-board conductors within the conductor group (net); the combined timing of each of the combined substrate-board conductors within the conductor group (net); and results (Delta) of the comparison of the combined timing of each the combined substrate-board conductors (net) to specific target net(s) within the group and to an allowed limit beyond the specific target net(s). Referring again to FIG. 1, the methods herein can further automatically provide user options to alter lengths of the substrate-board conductors that do not comply with the predetermined timing variance limit in item 142. The options to alter the length of the substrate-board conductors consider each of the substrate-board conductors as a single unit and thereby avoid duplicate offsetting length alterations to individual substrate conductors or board conductors.

Figure 5:
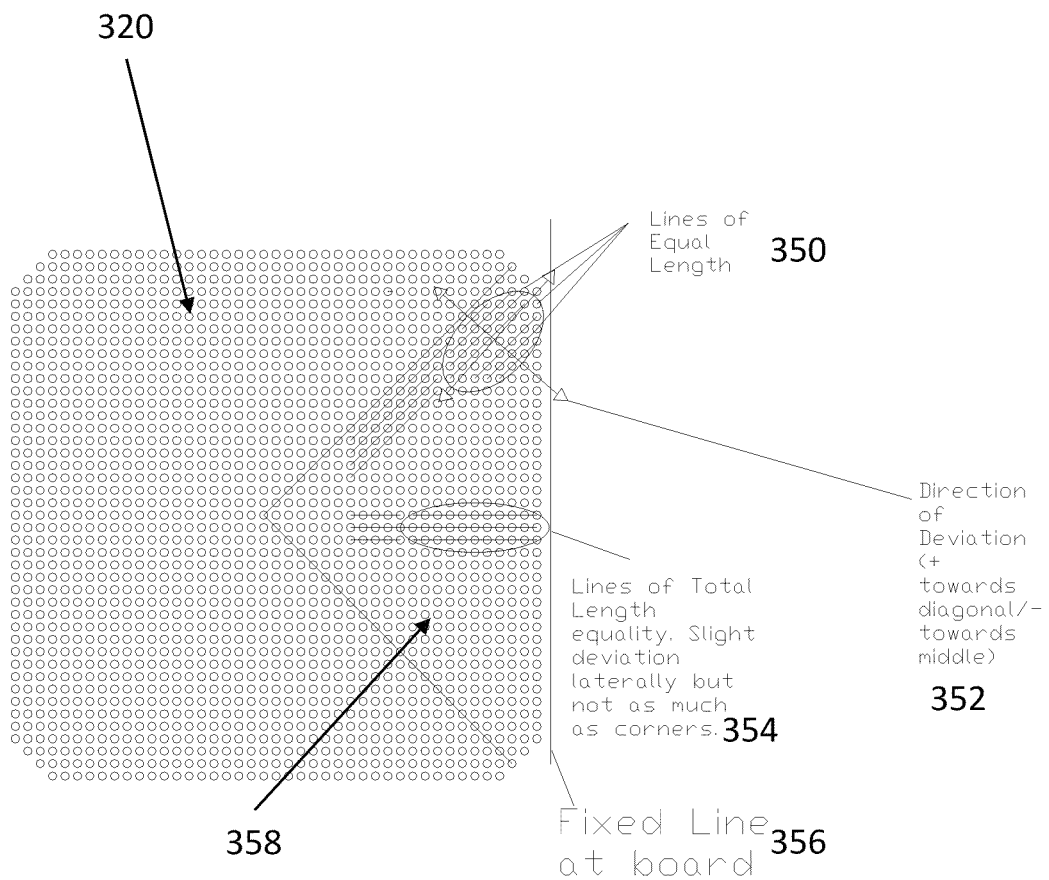
FIG. 5 is a top-view schematic diagram illustrating a ball grid array structure of the embodiments herein.

FIG. 5 illustrates a FCPBGA pattern 320 that is divided into quadrant 358 by two diagonal lines. These diagonal lines represent the signal escape area of the FCPBGA and board. In the early stages of design, these lines represent a prospective shortest path as opposed to eventual series of multiple vertical, diagonal and horizontal segments of "routed" conductors. These prospective paths are increasingly on an angle as the BGA pins become closer to the diagonal of the quadrant 358. There are a series of horizontal 354 and diagonal 350 lines located inside the quadrant 358. Each line is actually two lines that are end to end. The line that begins closest to center of the overall pattern represents wiring from the C4 pin of the chip to the BGA pin of the FCPBGA (and corresponds to the substrate conductors 324 discussed above). The second wire represents the wiring from the BGA of the board to a fixed line offset at a very small distance from outer row of BGA's on the board (and corresponds to the board conductors 326 discussed above).

For lines on the same "line of sight", that is same angle, these lines sum up to the same total length. For groups that do not fall on one "line of sight" but are rather clustered in an elliptical or wedge type shape (item 350), the lengths will deviate. They will get longer as movement towards the diagonal from the central "line of sight" is made and shorter when moving towards the center of the pattern, as shown by item 352. The lengthening and shortening affect is of higher magnitude at the diagonal as shown in the upper ellipse and lower magnitude and middle area shown by bottom ellipse (352). As shown above, the embodiments account for these different wire sections.

Another correction made by embodiments herein is for the oversimplification that C4 pins all start in one straight line. On an FCPBGA it is an area array of C4 pins. The affect of this is small since dimensions at the chip are an order of magnitude smaller. Still, x/y positions of terminals are inputted as well.

Adding these items together, a charting of netname and time delay addition is produced. This chart can be sent to a designer, or can be imported into the constraint area of an EDA tool forcing a length to be met. The computer program can be, for example, incorporated into for instance Cadence APD platform and run totally within the application.

Therefore, as shown above, the embodiments perform timing calculations for the combined substrate-board conductors and consider each of the substrate-board conductors as a single unit. These timing calculations avoid duplicate offsetting length alterations to individual substrate conductors or board conductors as is done conventionally and therefore, reduces the amount of wiring in both the substrate and the board. This reduces material usage, makes the device lighter and less expensive.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
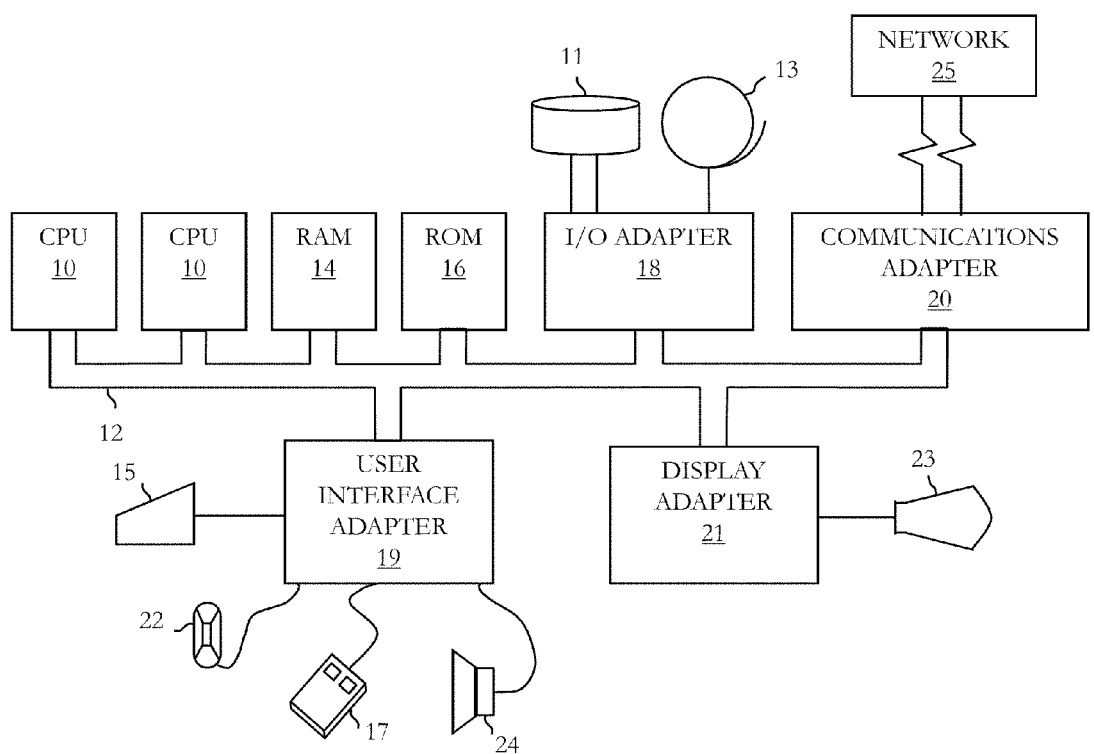
FIG. 6 is a schematic diagram of a hardware system according to embodiments herein.

A representative hardware environment for practicing the embodiments of the invention is depicted in FIG. 6. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 7:
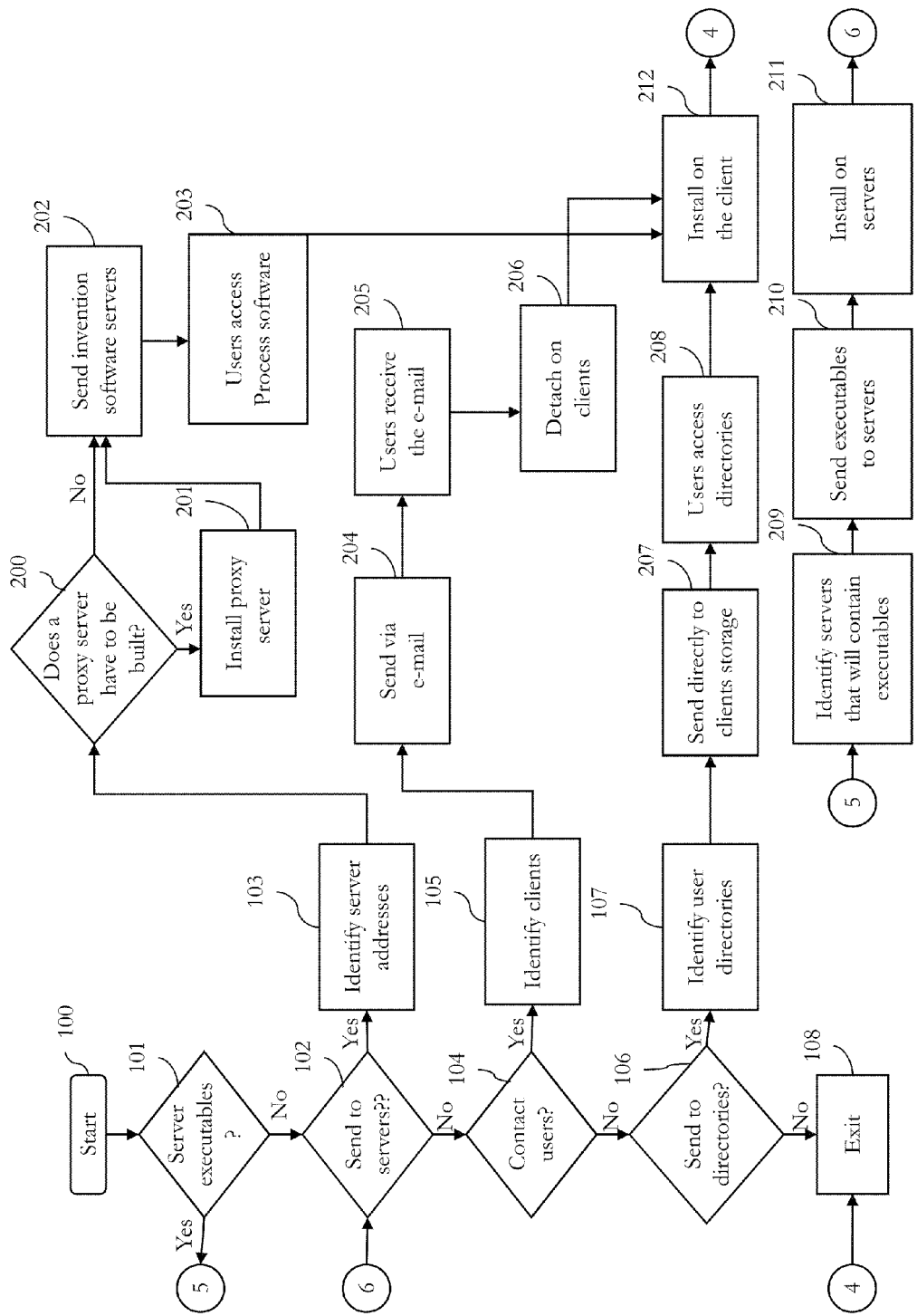
FIG. 7 is a schematic diagram of a deployment system according to embodiments herein.

As shown in FIG. 7, Step 100 begins the deployment of the process software. The first thing is to determine if there are any programs that will reside on a server or servers when the process software is executed 101. If this is the case then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers. The users then receive the e-mail 205 and then detach the process software from the e-mail to a directory on their client computers 206. The user executes the program that installs the process software on his client computer 212 then exits the process 108.

Lastly, a determination is made on whether to the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 8:
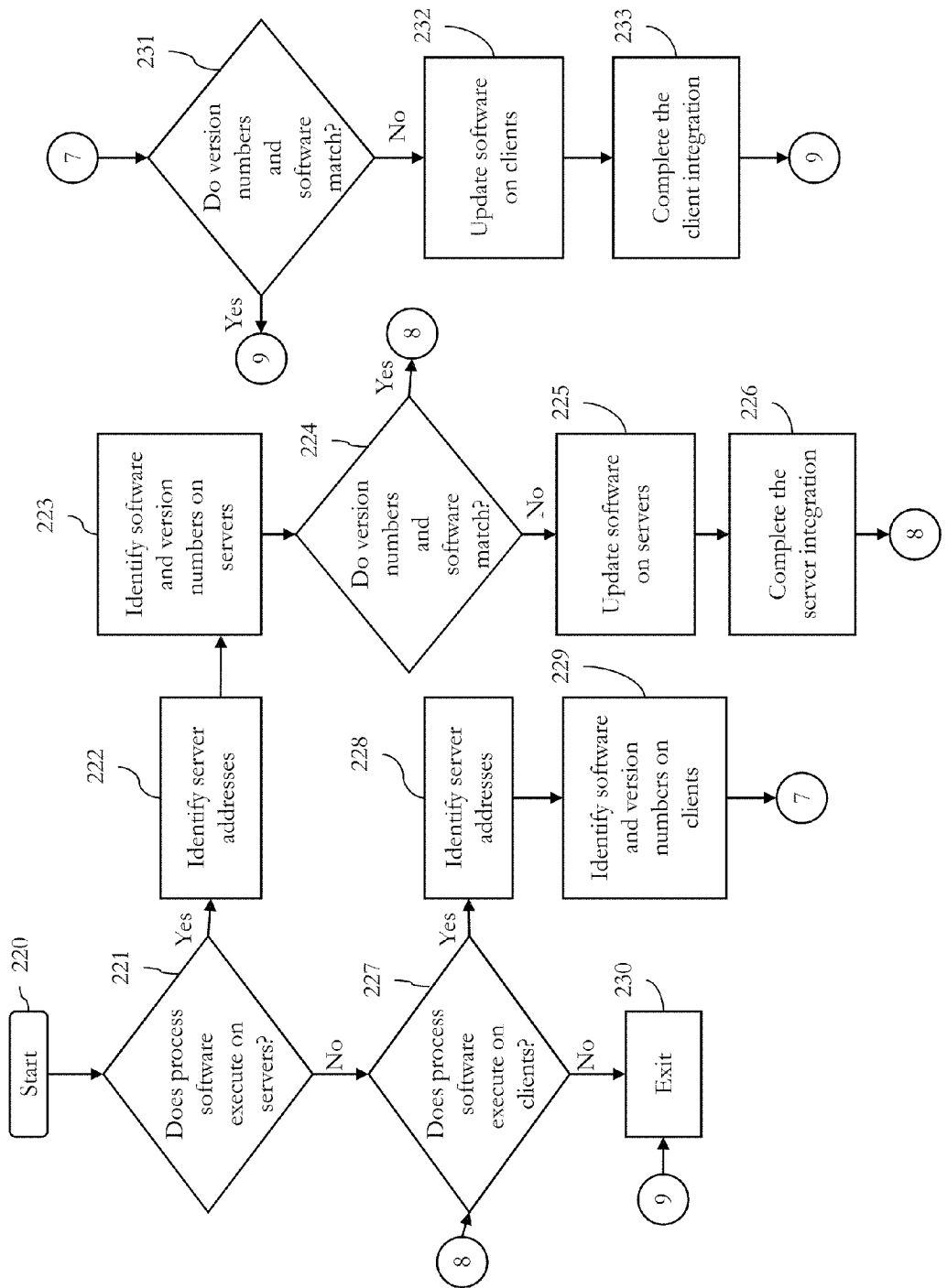
FIG. 8 is a schematic diagram of an integration system according to embodiments herein.

As shown in FIG. 8, Step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally if there is missing required software, then it is updated on the server or servers 225. The server integration is completed by installing the process software 226.

Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 9:
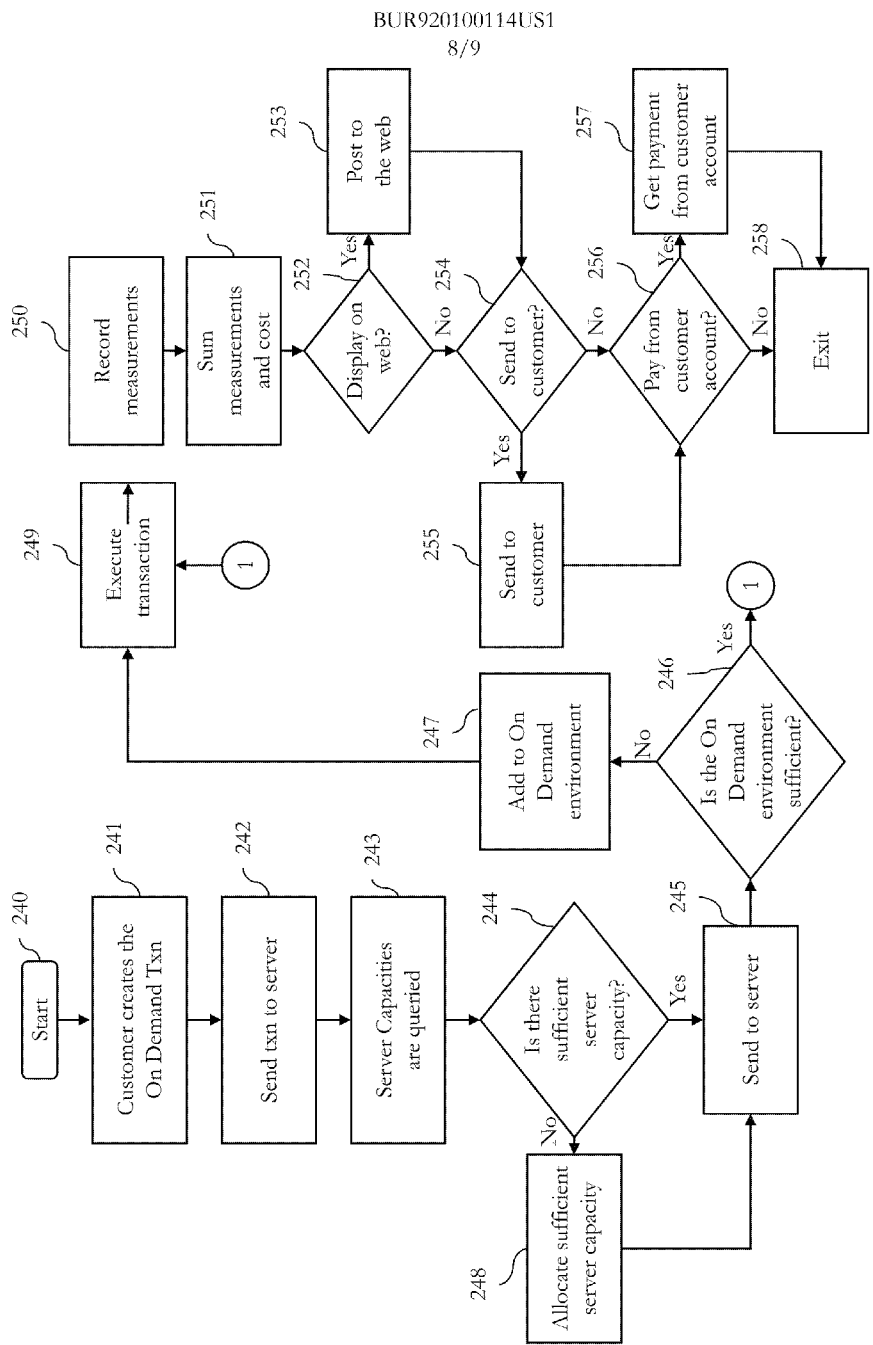
FIG. 9 is a schematic diagram of an on demand system according to embodiments herein.

As shown in FIG. 9, Step 240 begins the On Demand process. A transaction is created than contains the unique customer identification, the requested service type and any service parameters that further specify the type of service 241. The transaction is then sent to the main server 242. In an On Demand environment the main server can initially be the only server, then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, then the transaction is executed 249.

The usage measurements are recorded 250. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 10:
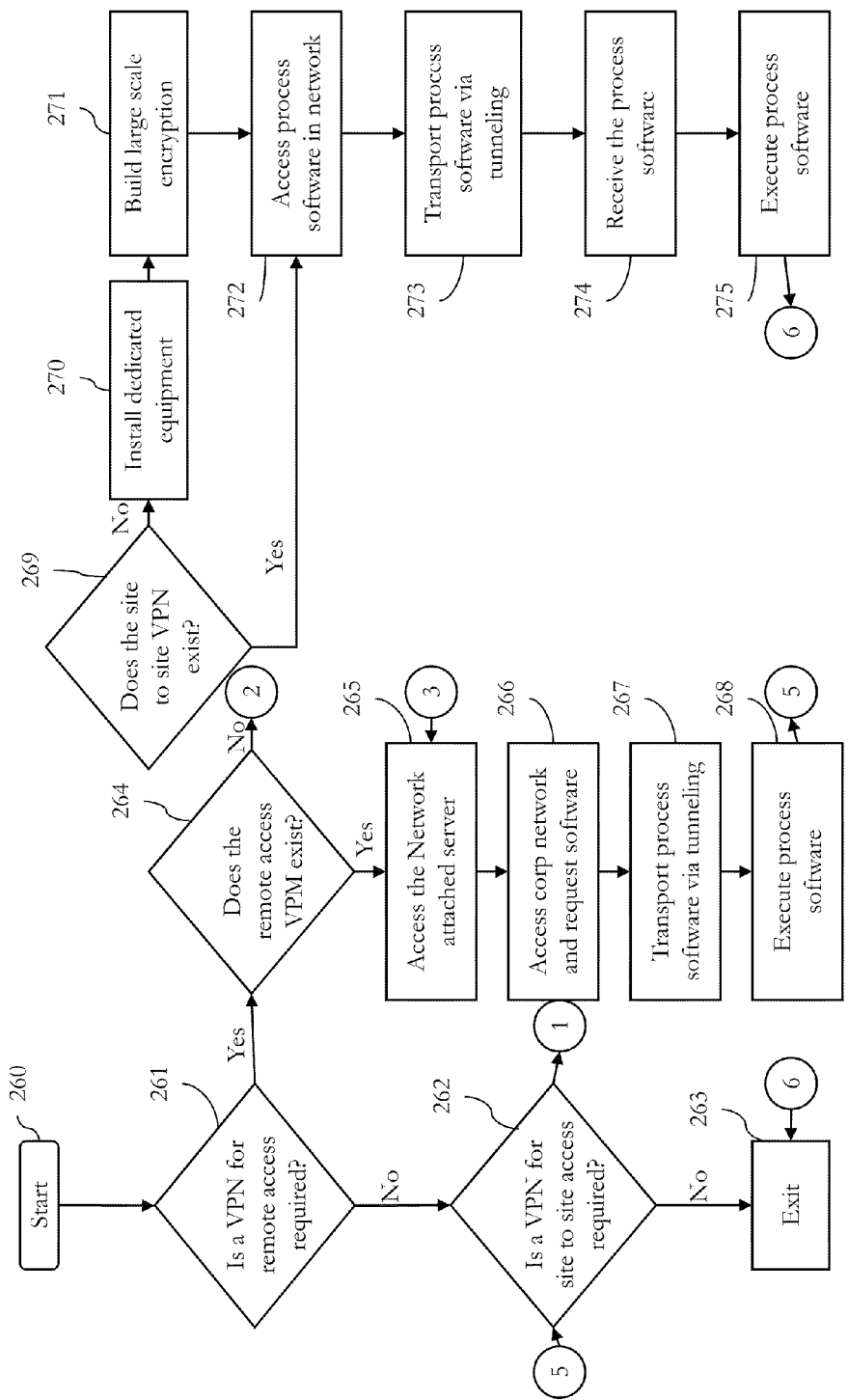
FIG. 10 is a schematic diagram of a virtual private network system according to embodiments herein.

As shown in FIG. 10, Step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computerized method of simultaneously comparing timing of conductive signal paths in a substrate and a printed circuit board to achieve a predetermined signal timing goal, said method comprising:
    identifying a conductor group within an integrated circuit design using a computing device, said conductor group comprising a plurality of substrate conductors within said substrate and a plurality of board conductors within said printed circuit board, each combination of substrate conductor and board conductor comprising one of a plurality of combined substrate-board conductors;
    automatically calculating a substrate-based length of time it will take a signal to pass within each of said substrate conductors within said conductor group based on a length of each of said substrate conductors and based on a speed with which signals pass within said substrate, using said computing device;
    automatically calculating a board-based length of time it will take a signal to pass within each of said board conductors within said conductor group based on a length of each of said board conductors and based on a speed with which signals pass within said printed circuit board, using said computing device;
    automatically adding said substrate-based length of time and said board-based length of time for each of said combined substrate-board conductors to produce a combined timing for each of said combined substrate-board conductors, using said computing device;
    automatically comparing said combined timing of each said combined substrate-board conductors to determine whether said combined substrate-board conductors pass signals within a predetermined timing variance limit, using said computing device;
    automatically reporting results of said comparing of said combined timing of each of said combined substrate-board conductors, using said computing device; and
    automatically providing user options to alter lengths of ones of said substrate-board conductors that do not comply with said predetermined timing variance limit, using said computing device.

2. The method according to claim 1, said speed with which signals pass within said substrate being different than said speed with which signals pass within said printed circuit board.

3. The method according to claim 1, said automatically reporting of said results comprising displaying, on a graphic user interface of said computing device, at least two of:
    names of said combined substrate-board conductors within said conductor group;
    said substrate-based length of time of each of said combined substrate-board conductors within said conductor group;
    said board-based length of time of each of said combined substrate-board conductors within said conductor group;
    said combined timing of each of said combined substrate-board conductors within said conductor group; and
    results of said comparing of said combined timing of each said combined substrate-board conductors.

4. The method according to claim 3, said displaying comprising displaying at least one of numerical values and graphical representations of said conductor group on said graphic user interface.

5. The method according to claim 1, said options to alter said length of ones of said substrate-board conductors consider each of said substrate-board conductors as a single unit and avoid duplicate offsetting length alterations to individual ones of said substrate conductors and said board conductors.

6. A computerized method of simultaneously comparing timing of conductive signal paths in a substrate and a printed circuit board to achieve a predetermined signal timing goal, said method comprising:
    identifying a conductor group within an integrated circuit design using a computing device, said conductor group comprising:
        a plurality of substrate conductors within said substrate; and
        a plurality of board conductors within said printed circuit board,
        each of said substrate conductors comprising:
            a first substrate conductor end electrically connected to at least one external electrical connection of an integrated circuit chip attached to said substrate, and
            a second substrate conductor end electrically connected to at least one of said board conductors within said printed circuit board,
        each of said board conductors comprising:

a first board conductor end electrically connected to at least one of said substrate conductors at said second substrate conductor end, and a second board conductor end positioned at a predetermined position within said printed circuit board, said second substrate conductor end of said substrate conductors being connected to said first board conductor end of said board conductors through a ball grid array of electrical connections between said substrate and said printed circuit board, and each combination of substrate conductor and board conductor that electrically connect one said external electrical connection of said integrated circuit chip to said predetermined position within said printed circuit board comprising one of a plurality of combined substrate-board conductors;

said method further comprising:

automatically calculating a substrate-based length of time it will take a signal to pass from said first substrate conductor end to said second substrate conductor end of each of said substrate conductors within said conductor group based on a length of each of said substrate conductors and based on a speed with which signals pass within said substrate, using said computing device;

automatically calculating a board-based length of time it will take a signal to pass from said first board conductor end to said second board conductor end of each of said board conductors within said conductor group based on a length of each of said board conductors and based on a speed with which signals pass within said printed circuit board, using said computing device;

automatically adding said substrate-based length of time and said board-based length of time for each of said combined substrate-board conductors to produce a combined timing for each of said combined substrate-board conductors, using said computing device;

automatically comparing said combined timing of each said combined substrate-board conductors to determine whether said combined substrate-board conductors pass signals within a predetermined timing variance limit, using said computing device; and automatically reporting results of said comparing of said combined timing of each of said combined substrate-board conductors, using said computing device.

7. The method according to claim 6, said speed with which signals pass within said substrate being different than said speed with which signals pass within said printed circuit board.

8. The method according to claim 6, said automatically reporting of said results comprising displaying, on a graphic user interface of said computing device, at least two of:

names of said combined substrate-board conductors within said conductor group;

said substrate-based length of time of each of said combined substrate-board conductors within said conductor group;

said board-based length of time of each of said combined substrate-board conductors within said conductor group;

said combined timing of each of said combined substrate-board conductors within said conductor group; and results of said comparing of said combined timing of each said combined substrate-board conductors.

9. The method according to claim 8, said displaying comprising displaying at least one of numerical values and graphical representations of said conductor group on said graphic user interface.

10. The method according to claim 6, further comprising automatically providing user options to alter lengths of ones of said substrate-board conductors that do not comply with said predetermined timing variance limit, using said computing device.

11. The method according to claim 10, said options to alter said length of ones of said substrate-board conductors consider each of said substrate-board conductors as a single unit and avoid duplicate offsetting length alterations to individual ones of said substrate conductors and said board conductors.

12. The method according to claim 6, said predetermined position within said printed circuit board comprising one of:

the same location for all of said board conductors within said conductor group; and a line parallel to a physical edge of said printed circuit board.

13. A non-transitory computer storage device comprising a computer-readable storage medium storing instructions executable by a computer to cause said computer to perform a method of simultaneously comparing timing of conductive signal paths in a substrate and a printed circuit board to achieve a predetermined signal timing goal, said method comprising:

identifying a conductor group within an integrated circuit design using a computing device, said conductor group comprising a plurality of substrate conductors within said substrate and a plurality of board conductors within said printed circuit board, each combination of substrate conductor and board conductor comprising one of a plurality of combined substrate-board conductors;

automatically calculating a substrate-based length of time it will take a signal to pass within each of said substrate conductors within said conductor group based on a length of each of said substrate conductors and based on a speed with which signals pass within said substrate, using said computing device;

automatically calculating a board-based length of time it will take a signal to pass within each of said board conductors within said conductor group based on a length of each of said board conductors and based on a speed with which signals pass within said printed circuit board, using said computing device;

automatically adding said substrate-based length of time and said board-based length of time for each of said combined substrate-board conductors to produce a combined timing for each of said combined substrate-board conductors, using said computing device;

automatically comparing said combined timing of each said combined substrate-board conductors to determine whether said combined substrate-board conductors pass signals within a predetermined timing variance limit, using said computing device;

automatically reporting results of said comparing of said combined timing of each of said combined substrate-board conductors, using said computing device; and automatically providing user options to alter lengths of ones of said substrate-board conductors that do not comply with said predetermined timing variance limit, using said computing device.

14. The non-transitory computer storage device according to claim 13, said speed with which signals pass within said substrate being different than said speed with which signals pass within said printed circuit board.

15. The non-transitory computer storage device according to claim 13, said automatically reporting of said results comprising displaying, on a graphic user interface of said computing device, at least two of:

names of said combined substrate-board conductors within said conductor group;

said substrate-based length of time of each of said combined substrate-board conductors within said conductor group;

said board-based length of time of each of said combined substrate-board conductors within said conductor group;

said combined timing of each of said combined substrate-board conductors within said conductor group; and results of said comparing of said combined timing of each said combined substrate-board conductors.

16. The non-transitory computer storage device according to claim 15, said displaying comprising displaying at least one of numerical values and graphical representations of said conductor group on said graphic user interface.

17. The non-transitory computer storage device according to claim 13, said options to alter said length of ones of said substrate-board conductors consider each of said substrate-board conductors as a single unit and avoid duplicate offsetting length alterations to individual ones of said substrate conductors and said board conductors.

\* \* \* \* \*